(12) United States Patent
Endler et al.

(10) Patent No.: US 9,062,370 B2
(45) Date of Patent: Jun. 23, 2015

(54) BODIES COATED BY SIC AND METHOD FOR CREATING SIC-COATED BODIES

(75) Inventors: Ingolf Endler, Coswig (DE); Mandy Höhn, Dresden (DE); Thoralf Gebel, Dresden (DE); Christian Bauch, Bitterfeld-Wolfen (DE); Rumen Deltschew, Leipzig (DE); Sven Holl, Gückingen (DE); Gerd Lippold, Leipzig (DE); Javad Mohsseni, Bitterfeld-Wolfen (DE); Norbert Auner, Glashütten (DE)

(73) Assignee: Spawnt Private S.a.r.l., Luxembourg (LU)

( * ) Notice: Subject to any disclaimer, the term of this patent is extended or adjusted under 35 U.S.C. 154(b) by 366 days.

(21) Appl. No.: 13/262,406

(22) PCT Filed: Mar. 17, 2010

(86) PCT No.: PCT/EP2010/053436
§ 371 (c)(1),
(2), (4) Date: Apr. 23, 2012

(87) PCT Pub. No.: WO2010/112339
PCT Pub. Date: Oct. 7, 2010

(65) Prior Publication Data
US 2012/0202054 A1    Aug. 9, 2012

(30) Foreign Application Priority Data
Apr. 2, 2009    (DE) .................. 10 2009 002 129

(51) Int. Cl.
*B32B 9/00*    (2006.01)
*C23C 16/32*    (2006.01)
(Continued)

(52) U.S. Cl.
CPC ........... *C23C 16/325* (2013.01); *Y10T 428/264* (2015.01); *B32B 18/00* (2013.01); *C22C 29/065* (2013.01); *B82Y 30/00* (2013.01); *C23C 16/30* (2013.01)

(58) Field of Classification Search
None
See application file for complete search history.

(56) References Cited

U.S. PATENT DOCUMENTS

| 3,011,912 A | 12/1961 | Gareis et al. |
| 4,228,142 A | 10/1980 | Holcombe, Jr. et al. |

(Continued)

FOREIGN PATENT DOCUMENTS

| DE | 1 184 738 | 1/1965 |
| DE | 40 20 621 A1 | 1/1991 |

(Continued)

OTHER PUBLICATIONS

Reznik et al. "Microstructure of SiC deposited from methyltrichlorosilane" 2003, J. Eur. Ceram. Soc. vol. 23, pp. 1499-1508.*

(Continued)

*Primary Examiner* — Humera Sheikh
*Assistant Examiner* — Seth Dumbris
(74) *Attorney, Agent, or Firm* — DLA Piper LLP (US)

(57) ABSTRACT

Bodies coated with a SiC layer or with a multilayer coating system that include at least a SiC hard material layer, wherein the SiC layer consists of halogen-containing nanocrystalline 3C—SiC or a mixed layer which consists of halogen-containing nanocrystalline 3C—SiC and amorphous SiC or halogen-containing nanocrystalline 3C—SiC and amorphous carbon.

11 Claims, 3 Drawing Sheets

(51) Int. Cl.
  *B82Y 30/00* (2011.01)
  *C23C 16/30* (2006.01)
  *B32B 18/00* (2006.01)
  *C22C 29/06* (2006.01)

(56) References Cited

U.S. PATENT DOCUMENTS

| | | | |
|---|---|---|---|
| 4,751,099 A * | 6/1988 | Niino et al. | 427/450 |
| 5,309,874 A * | 5/1994 | Willermet et al. | 123/90.51 |
| 5,425,860 A * | 6/1995 | Truher et al. | 204/192.23 |
| 5,670,253 A * | 9/1997 | Chiu et al. | 428/336 |
| 6,117,233 A | 9/2000 | Bill et al. | |
| 7,404,858 B2 | 7/2008 | Koshka | |
| 2004/0222501 A1 | 11/2004 | Kordina | |
| 2005/0048765 A1 | 3/2005 | Kim | |
| 2005/0233127 A1* | 10/2005 | Steffier | 428/292.1 |
| 2007/0281183 A1 | 12/2007 | Hosoe et al. | |
| 2008/0110486 A1 | 5/2008 | Tsakalakos et al. | |
| 2008/0289690 A1 | 11/2008 | Sonnenschein et al. | |
| 2010/0080746 A1 | 4/2010 | Lang et al. | |

FOREIGN PATENT DOCUMENTS

| | | |
|---|---|---|
| DE | 690 13 965 T2 | 5/1995 |
| DE | 195 03 976 C1 | 5/1996 |
| DE | 195 22 923 A1 | 3/1997 |
| DE | 102 09 793 A1 | 9/2003 |
| DE | 10 2006 003 464 A1 | 7/2007 |
| DE | 694 34 949 T2 | 12/2007 |
| DE | 102007 4051 884 A1 | 7/2008 |
| DE | 10 2007 007 874 A1 | 8/2008 |
| DE | 11 2004 001 530 B4 | 7/2009 |
| EP | 0 393 985 A2 | 10/1990 |
| EP | 0 935 013 A1 | 8/1999 |
| EP | 1 950 810 A2 | 7/2008 |
| GB | 2 233 971 A | 1/1991 |
| JP | 61-295372 | 12/1986 |
| JP | 62-007122 A | 1/1987 |
| JP | 62-139318 A | 6/1987 |
| JP | 63-164426 A | 7/1988 |
| JP | 64-000267 A | 1/1989 |
| JP | 02-074571 A | 3/1990 |
| JP | 02-199066 A | 8/1990 |
| JP | 08-319186 A | 12/1996 |
| JP | 2002-180254 A | 6/2002 |
| WO | 01/20672 A1 | 3/2001 |
| WO | 03/078702 A1 | 9/2003 |
| WO | 2004/023525 A2 | 3/2004 |
| WO | 2004/100221 A2 | 11/2004 |
| WO | 2005/036593 A2 | 4/2005 |
| WO | 2006/078354 A2 | 7/2006 |

OTHER PUBLICATIONS

Liao et al. "Superhard nanocrystalline silicon carbide films" 2005, App. Phys. Lett. vol. 86, pp. 171913-1-171913-3.*
STIC search.*
Mitchell et al. ("Formation of Nanocyrstalline SiC Powder from Chlorine-Containing Polycarbosilane Precursors", 2000, Mat. Res. Soc. Symp. Proc., vol. 581, pp. 205-209.*
Suemitsu, T. et al., "Preparation of Silicon Carbide Films by Chemical Vapor Deposition Using $SiCl_4$-$CH_4$-$H_2$Gases," *J. Japan Inst. Metals*, 1999, vol. 63, No. 7, pp. 882-887 (English Abstract on first page).
Yoon, J.-K. et al., "Kinetics of Chemical Vapor Deposition of Si on Ni Substrates from a $SiCl_4$- $H_2$ Gas Precursor Mixture," *Surface and Coatings Technology* 2003, vol. 172, issue 1, pp. 65-71 (3 sheets only with Abstract and Fig. 1-7).
Bloem, J. et al., "Nucleation and Growth of Silicon Films by Chemical Vapour Deposition," *Philips Technical Rev. 41*, 1983/84, No. 2, pp. 60-69.
Miyajima, S. et al., "Properties of n-Type Hydrogenated Nanocrystalline Cubic Silicon Carbide Films Deposited by VHF-PECVD at a Low Substrate Temperature," *Journal of Non-Crystalline Solids*, 20008, vol. 354, pp. 2350-2354.
Pierson, H. O., "Handbook of Refractory Carbides and Nitrides," *Noyes Publications*, Westwood, New Jersey, USA, cover, pp. 149-150.
Schiepers, R. C. J. et al., "The Interaction between SiC and Ni, Fe, (Fe,Ni) and Steel: Morphology and Kinetics," *Journal of the European Ceramic Society*, 1993, vol. 11, pp. 211-218.
Wilden, J. V. et al., "SiC-Schichtsynthese aus flüssigen Ausgangsstoffen mittels DC-Plasmajet-CVD," *Galvanotechnik*, 2000, vol. 91, No. 8, pp. 2250-2256.
Carter, C. H. et al., "Progress in SiC: from Material Growth to Commercial Device Development," *Materials Science and Engineering*, 1999, vol. B61-62, pp. 1-8.
Costa, A. K. et al., "Amorphous SiC Coatings for WC Cutting Tools," *Surface and Coatings Technology*, 2003, vol. 163-164, pp. 176-180.
Giunta, G. et al., "Investigation of Interfaces of Chemically Vapour Deposited SiC, SiC-Ti(N,C) Based Cermets," *Surface and Coatings Technology*, 1991, vol. 49, pp. 174-180.
Jian-Feng, H. et al., "SiCn/SiC Oxidation Protective Coating for Carbon/Carbon Composites," *Carbon*, 2009, vol. 47, pp. 1198-1201.
Motojima, S. et al., "Deposition and Microhardness of SiC from the $Si_2Cl_6$-$C_3H_8$-$H_2$-Ar System," *Journal of Materials Science*, 1986, vol. 21, pp. 1363-1367.
Sevastyanov, V, et al., "Perchlorosilanes and Perchlorocarbosilanes as Precursors to Silicon Carbide" *Materials Research Society Symp. Proc.*, 2006, vol. 911, B05-12 (7 pages).
"Abscheidung von Siliciumcarbid aus der Gasphase," *aus einer Doktorarbeit*, pp. 9-40.
Ban, V. S. et al., "The Chemistry and Transport Phenomena of Chemical Vapor Deposition of Silicon from $SiCl_4$," *RCA Laboratories*, Princeton, New Jersey 08540, 2002, Abstract.
Kerdiles, S. et al., "Low Temperature Direct Growth of Nanocrystalline Silicon Carbide Films," *LERMAT-ISMRA, UPRESA 6004(France) and Dept. d'Electronica, Unitat Associada CNM-CSIC(Spain)*, 2000, 3 sheets of Abstract and Figs. 1-6.
Korec, J., "Model of Silicon Expitaxial Growth in $SiCl_4$-HCl-$H_2$System Based on Flow Graph," *Journal of Crystal Growth*, 1979, vol. 46, issue 3, pp. 362-370 (Abstract only—1 page).
Kósza, G. et al., "Optimization of Si Epitaxial Growth," *Journal of Crystal Growth*, 1981, vol. 52 (part 1), pp. 207-212 (Abstract only—2 pages).
Lim, D.-C. et al., "Enhanced Hardness in Two-Layer a BON/nc-SiC Coating Prepared by Plasma-Assisted MOCVD and Thermal MOCVD," *Surface and Coatings Technology*, 2005, vol. 193, issues 1-3, pp. 162-166 (3 sheets only with Abstract and Figs. 1-5).
Madani, M. et al., "Influence of Hydrogen Dilution and Substrate Temperature on Growth of Nanocrystalline Hydrogenated Silicon Carbide Films Deposited by RF Sputtering," *Microelectronics Journal*, 2006, vol. 37, issue 10, pp. 1031-1035 (3 sheets only with Abstract and Figs. 1-9).
Mitani, K. et al., "Deposition and Properties of Polycrystalline Si for Solar Cells," *Japanese Journal of Applied Physics*, 1980, Suppl. 19-2, pp. 1-5 (1 sheet only with Abstract).
Motojima, S. et al., "Preparation and Properties of Cobalt Silicides by Diffusion and CVD Processes Using $Si_2Cl_6$as a Silicon Source," *Journal of the Less Common Metals*, 1986, vol. 124, issues 1-2, pp. 193-204 (2 sheets only with Abstract).
Nigam, S. et al., "Growth Kinetics and Polytype Stability in Halide Chemical Vapor Deposition of SiC," *Materials Science Forum*, 2006, vols. 527-259, pp. 27-30.
Nishiguchi, T. et al., "CVD Growth of 3C-SiC on Various Orientations of Si Substrates for the Substrate of Nitride Semiconductors," *Phys. Stat. Sol.*, 2003, No. 7, pp. 2585-2588.
Nishizawa, J. et al., "Mechanisms of Chemical Vapor Deposition of Silicon," *Journal of Crystal Growth*, 1978, vol. 45, pp. 82-89 (2 sheets only with Abstract).
Nishizawa, J. et al., "Mechanism of Chemical Vapor Deposition of Silicon," *Journal of Crystal Growth*, 1981, vol. 52 (part 1), pp. 213-218 (2 sheets only with Abstract).

(56) References Cited

OTHER PUBLICATIONS

Numata, M. et al., "Silicon Chemical Vapor Deposition from $Si_2Cl_8$ and $Si_3Cl_8$," *First Int. Conf. on Processing Materials for Properties*, 1993, pp. 1249-1252.

Polyakov, A.Y. et al., "Halide-CVD Growth of Bulk SiC Crystals," *Materials Science Forum*, 2006, vol. 527-529, pp. 21-26.

Saito, N. et al., "Prediction of Elementary Reaction Mechanism for the CVD Process in $Si_2Cl_6$-$H_2$ System Using Semi-Empirical Molecular Orbital Method," *Journal of the Japan Institute of Metals*, 1999, vol. 63, No. 3, pp. 319-325.

Spruiell, J. E., "Chemical Vapor Deposition of Silicon Carbide from Silicon Tetrachloride-Methane-Hydrogen Mixtures," *Journal of the 2nd Int. Conf. of Chemical Vapour Deposition*, 1970, pp. 279-295.

Suemitsu, T. et al., "Preparation of Silicon Carbide Films by Chemical Vapor Deposition Using $SiCl_4$-$CH_4$-$H_2$ Gases," *J. Japan Inst. Metals*, 1999, vol. 63, No. 7, pp. 882-887 (English Abstract on first page).

Yoon, J.-K. et al., "Kinetics of Chemical Vapor Deposition of Si on Ni Substrates from a $SiCl_4$- $H_2$ Gas Precursor Mixture," *Surface and Coatings Technology*, 2003, vol. 172, issue 1, pp. 65-71 (3 sheets only with Abstract and Fig. 1-7).

Bloem, J. et al., "Nucleation and Growth of Silicon Films by Chemical Vapour Deposition," *Philips Technical Rev. 41*, 1983/84, No. 2, pp. 60-68.

Bloem, J. et al., "Rate-Determining Reactions and Surface Species in CVD Silicon: IV. The $SiCl_4$-$H_2$-$N_2$ and the $SiHCl_3$-$H_2$-$N_2$ System," *Philips Research Laboratories*, 2002, Abstract only (1 sheet).

Chang, C-A, "On the Enhancement of Silicon Chemical Vapor Deposition Rates at Low Temperatures," *Journal of the Electrochemical Society*, 1976, vol. 123, issue 8, pp. 1245-1247 (1 sheet only).

Colder, H. et al., "Low-Temperature Processing and Properties of Nanocrystalline-SiC/Crystalline Si Heterojunction Devices," *Solid-State Electronics*, 2006, vol. 50, issue 2, pp. 209-213 (3 sheets only with Abstract and Figs. 1-6).

Dhanaraj, G. et al., "Growth and Surface Morphologies of 6H SiC Bulk and Epitaxial Crystals," *Materials Science Forum*, 2006, vols. 527-529, pp. 67-70.

Fanton, M. A. et al., "Thermodynamic Equilibrium Limitations on the Growth of SiC by Halide Chemical Vapor Disposition," *Journal of Applied Physics*, 2007, vol. 101 (2 sheets only with Abstract).

Gorelik, S. S. et al., "Effect of Deposition Conditions on the Texture and Substructure of Chemical-Vapor-Deposited Polycrystalline Silicon Films," *Inorganic Materials*, 1994, vol. 30, No. 3, pp. 298-301.

Chinese Official Action dated Oct. 28, 2013, along with an English translation from corresponding Chinese Patent Application No. 201080019554.6.

English translation of Japanese Notice of Reasons for Refusal dated Oct. 30, 2013 from corresponding Japanese Patent Application No. 2012-502557.

Bouyer, E. et al., "Characterization of SiC and $Si_3N_4$ Coatings synthesized by means of inductive thermal plasma from disilane precursors," Applied Organometallic Chemistry, 2001, vol. 15; pp. 833-840.

Hyun, J.-S. et al., "Growth of 3C-SiC nanowires on nickel coated Si(100) substrate using dichloromethylvinylsilane and diethylmethylsilane by MOCVD method," Physicians Status Solidi, C6, No. 4, pp. 810-812, (2009).

\* cited by examiner

BODIES COATED BY SIC AND METHOD FOR CREATING SIC-COATED BODIES

RELATED APPLICATIONS

This is a §371 of International Application No. PCT/EP2010/053436, with an international filing date of Mar. 17, 2010 (WO 2010/112339 A1, published Oct. 7, 2010), which is based on German Patent Application No. 10 2009 002 129.9, filed Apr. 2, 2009, the subject matter of which is incorporated by reference.

TECHNICAL FIELD

This disclosure concerns bodies coated with a SiC layer or with a layer system that contains at least one SiC layer, and a process for the manufacture of such coated bodies.

BACKGROUND

Nanocrystalline nc-3C—SiC and amorphous a-SiC layers of varying composition have been described for application in microelectronics and photovoltaics and as an oxidation protection layer. In addition to crystalline SiC layers with a cubic structure, which are referred to as beta- or 3C—SiC layers, there are also crystalline alpha-SiC layers, which can only be obtained at high temperatures above 1300° C. (C. H. Carter, V. F. Tsvetkov, R. C. Glass, D. Henshall, M. Brady, St. G. Müller, O. Kordina, K. Irvine, J. A. Edmond, H.-S. Kong, R. Sing, S. T. Allen, J. W. Palmour, Materials Science and Engineering, B61-62 (1999), 1-8). This high-temperature modification is only relevant for a few applications in microelectronics.

Hydrogenous 3C—SiC layers, which may also be nanocrystalline, are also known. A semiconductor component with hydrogen-containing microcrystalline μc-SiC:H is described in EP 1 950 810 A2. For photovoltaics, hydrogen-containing nanocrystalline nc-3C—SiC:H is used as a window layer in heterojunction solar cells (S. Miyajima, M. Sawamura, A. Yamada, M. Konagai, Journal of Non-Crystalline Solids, 354 (2008), 2350-2354). Such layers are characterized by a high hydrogen content, which rules out their application as a wear protection layer if temperatures are above 500° C. (A. K. Costa, S. S. Camargo, Surface and Coatings Technology, 163-164 (2003), 176-180).

Hydrogen-free SiC possesses high oxidation resistance and is therefore also used as an oxidation protection layer (H. Jian-Feng, L. Miao, W. Bo, C. Li-Yun, X. Chang-Kui, W. Jian-Peng, Carbon, 47 (2009), 1189-1206).

SiC has rarely been used to date as a wear protection layer on tools and structural components. The reasons are its high brittleness (H. O. Pierson, Handbook of Refractory Carbides and Nitrides, NOYES Publications, Westwood, N.J., U.S.A., 1996) and its reactivity with ferrous materials at high temperatures (R. C. Schiepers, J. A. van Beek, F. J. J. van Loo, G. de With, Journal of the European Ceramic Society, 11 (1993), 211-218). Only in U.S. Pat. No. 3,011,912 and two references in the literature concerning the patent is there any mention of possible applications of crystalline or amorphous SiC layers as wear protection layers. A process is described for the manufacture of beta-SiC layers on inorganic substrates. These layers contain no chlorine, as chlorine-free starting materials are used. A wear-reducing protective layer on a very special structural component, namely gramophone needles, is given as a possible application. There is no mention of the exact structure and properties of the beta layer.

The manufacture of crystalline 3C—SiC layers with crystallite sizes of >0.3 μm on hard metal substrates is described in a scientific publication (G. Giunta, M. Fiorini, V. Vittori, G. Marchesano, Surface and Coatings Technology, 49 (1991), 174-180). A CVD process is described that uses methyltrichlorosilane at a temperature of 1000° C. Because of the high coating temperature, direct coating of hard metals is not possible. Harmful cobalt silicides are formed, and bond strength is insufficient. Hard metal can only be coated using complex intermediate layer systems that act as diffusion barriers.

A pure amorphous SiC layer on a hard metal tool is described by which reduction of abrasive wear was confirmed as measured by a tribometer test at up to 700° C. in A. K. Costa, S. S. Camargo, Surface and Coatings Technology, 163-164 (2003), 176-180.

Nanocrystalline and amorphous SiC layers, although they consist of sintered particles or clusters with a size of 50 nm to 500 nm and thus do not possess a homogeneous structure and composition, can be manufactured using the DC plasma jet CVD process (J. Wilden, A. Wank, Galvanotechnik 91 (2000), No. 8, 2250-2256). However, if chlorine-containing standard starting materials are used in that process such as trimethylchlorosilane or trichloromethylsilane, the layer will show chlorine concentrations that are so high that they adversely affect the described coating of steels and metals. The chlorine concentration is particularly high in the interface area to the substrate.

It could therefore be helpful to provide bodies with SiC layers that possess a particle-free, non-porous structure, a high degree of hardness, low brittleness, high bond strength, good oxidation resistance, and a high resistance to crack growth.

SUMMARY

We provide bodies coated with a SiC layer or with a multilayer coating system that includes at least a SiC hard material layer, wherein the SiC layer consists of halogen-containing nanocrystalline 3C—SiC or a mixed layer which consists of halogen-containing nanocrystalline 3C—SiC and amorphous SiC or halogen-containing nanocrystalline 3C—SiC and amorphous carbon.

We also provide a process of coating bodies with a SiC layer or with a multilayer coating system that includes at least one SiC layer, wherein the SiC layer consists of halogen-containing nanocrystalline 3C—SiC or a mixed layer, which consists of halogen-containing nanocrystalline 3C—SiC and amorphous SiC or halogen-containing nanocrystalline 3C—SiC and amorphous carbon, including coating the bodies with a thermal CVD process, wherein a gas mixture in the thermal CVD process contains $H_2$ and/or one or more inert gases, one or more of the halogen polysilanes of the formulas $Si_nX_{2n}$, $Si_nX_{2n+2}$, or $Si_nX_yH_z$, wherein X is a halogen and n is ≥2, and one or more hydrocarbons, or $H_2$ and/or one or more inert gases contain of one or more halogen polysilanes substituted with organic substituents R and having formulas $Si_nX_yR_z$ or $Si_nH_xX_yR_z$, wherein X is the halogen and n≥2, z>0, and y≥1, and the stoichiometric relationships 2n+2=y+z or 2n=y+z apply for $Si_nX_yR_z$, and the stoichiometric relationships 2n+2=x+y+z or 2n=x+y+z apply for $Si_nH_xX_yR_z$.

DETAILED DESCRIPTION

Figure 1:
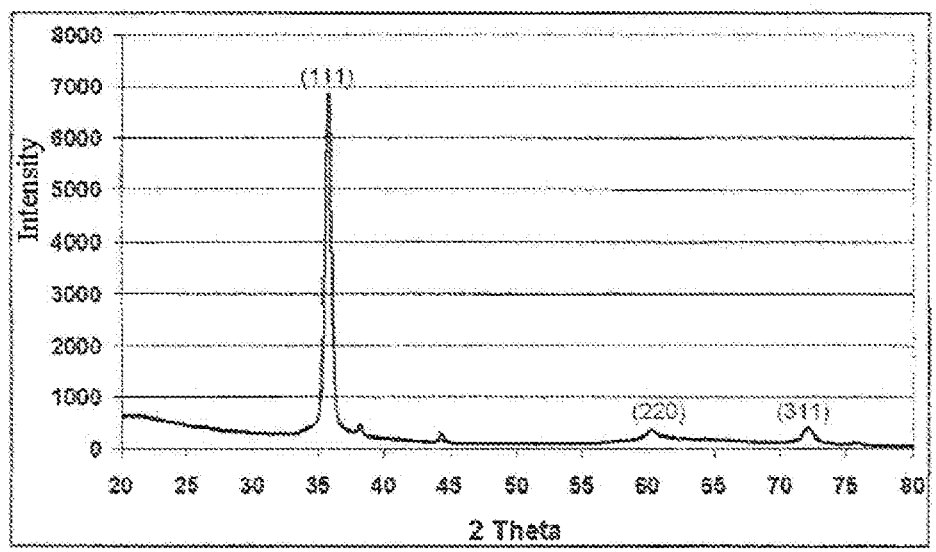
FIG. 1 is a diffractogram of the nanocrystalline 3C—SiC layer according to Example 1.

The bodies are coated with a SiC layer or with a multilayer coating system that contains at least a SiC layer, wherein the SiC layer consists of halogen-containing nanocrystalline 3C—SiC or a mixed layer, which consists of halogen-containing nanocrystalline 3C—SiC and amorphous SiC or halogen-containing nanocrystalline 3C—SiC and amorphous carbon.

The SiC layer has a cluster-free, homogeneous structure. This means that the layer does not have a higher-level structure of clusters or particles with additional, process-related grain boundaries, which is, conversely, the case in J. Wilden, A. Wank, Galvanotechnik 91 (2000), No. 8, 2250-2256. This type of cluster-free structure allows undesired inhomogeneities in the composition, which inevitably occur at such particle boundaries, to be avoided.

The SiC layer has a cluster-free, homogeneous structure and/or a non-porous, dense structure.

Preferably, the SiC layer may have a periodically or continuously varying ratio of halogen-containing nanocrystalline 3C—SiC to amorphous SiC or amorphous carbon.

The SiC layer preferably contains Cl, F, Br, and/or I as halogens.

Preferably, the halogen content of the SiC layer is 0.0001 at. % to 2 at. %.

The mixed layer contains amorphous SiC in an amount of 0.5 mass % to 99.5 mass %.

The amorphous SiC has a C:Si atomic ratio of 1 to 1.2.

The nanocrystalline 3C—SiC contains amorphous carbon in an amount of 0 to 10 mass %.

The nanocrystalline 3C—SiC has a crystallite size of <200 nm.

The SiC layer has a thickness of 0.1 μm to 100 μm.

The multilayer coating system consists of several SiC layers or at least one SiC layer and one or more layers selected from the group of the materials TiN, TiCN, TiC, $Al_2O_3$, and diamond.

The SiC layer can deposited directly on the body, avoiding the use of an intermediate layer.

The SiC layer or the multilayer coating system is applied to bodies of metal, hard metal, cermet or ceramic as a wear protection or oxidation protection layer. The SiC layer or the multilayer coating system is also applied to the corresponding substrates for applications in microelectronics or photovoltaics.

To coat bodies with a SiC layer or with a multilayer coating system that contains at least a SiC layer, a process includes steps wherein the bodies are coated by a thermal CVD process, wherein a gas mixture contains $H_2$ and/or one or more inert gases, one or more of the halogen polysilanes of the formulas $Si_nX_{2n}$, $Si_nX_{2n+2}$, or $Si_nX_yH_z$, wherein X is the halogen and n is ≥2, and one or more hydrocarbons.

Alternatively, a gas mixture is used that contains $H_2$ and/or one or more inert gases of one or more halogen polysilanes substituted with organic substituents R and having formulas $Si_nX_yR_z$ or $Si_nH_xX_yR_z$, wherein X is the halogen and n≥2, z>0, and y≥1. In this case, the stoichiometric relationships 2n+2=y+z or 2n=y+z apply for $Si_nX_yR_z$, and the stoichiometric relationships 2n+2=x+y+z or 2n=x+y+z apply for $Si_nH_xX_yR_z$.

In this process, $Si_2X_6$, $Si_3X_8$, $Si_4X_8$, $Si_4X_{10}$, $Si_5X_{10}$, $Si_5X_{12}$, and $Si_6X_{12}$ are used as halogen polysilanes, wherein X=Cl, F, Br, and/or I.

The bodies are coated in this method by a thermal CVD process at temperatures 600° C. to 950° C., and preferably at temperatures 600° C. to 800° C.

As an organic substituent, $CH_3$ can be advantageously used.

$(CH_3)_2Si_2Cl_4$ and/or $(CH_3)_4Si_2Cl_2$ may be used in the gas mixture as halogen polysilanes with organic substituents.

Alkanes, alkenes, or alkynes may be used as hydrocarbons. $CH_4$, $C_2H_4$, or $C_2H_2$ may be used as hydrocarbons.

It is advisable to carry out coating in a hot-wall CVD reactor at a pressure of 1 kPa to 101.3 kPa.

The process can be used to coat bodies of metal, hard metal, cermet or ceramic with a wear protection or oxidation protection layer or for coatings in microelectronics or photovoltaics.

The SiC hard material layers have a series of highly advantageous properties.

The layers consist exclusively of SiC nanocrystals or SiC nanocrystals and amorphous regions demarcated from one another by crystal grain boundaries. However, they do not have a higher-level structure of clusters or particles with additional, process-related grain boundaries. Because of this type of cluster-free structure, undesired inhomogeneities in the composition, which inevitably occur at such particle boundaries, are avoided. The SiC layers possess a high degree of hardness, low brittleness, and high bond strength, and they are suitable to coat without intermediate layers.

The layers advantageously have a dense and homogeneous structure, a high degree of hardness, and high bond strength. The structure of nanocrystalline SiC or nanocrystalline SiC containing portions of amorphous SiC or amorphous carbon allows for extremely favorable coating, even of the sharp-edged cutting blades of tools.

As continuous grain boundaries from the layer surface to the substrate are avoided by the layer structure, favorable oxidation resistance and improved resistance to crack growth are achieved even at high operating temperatures such as those occurring in machining.

Surprisingly, inclusion of portions of softer, amorphous SiC or amorphous carbon does not cause a decrease in hardness compared to a pure 3C—SiC layer. Formation of a nanocomposite structure has an increasing or stabilizing effect on hardness within certain limits.

A further advantage lies in the application of nanocrystalline 3C—SiC layers as an adhesion-improving bonding layer in substrate layer composites. On the one hand, they can improve adhesion of subsequent layers to ceramic bodies, e.g., of $Si_3N_4$, or on the other hand, they can ensure high bonding strength to a subsequent diamond layer. This is achieved due to their low thermal expansion coefficient and their nanocrystalline structure. A particularly advantageous construction is a series of layers of nanocrystalline SiC and nanocrystalline diamond, which even makes it possible to coat sharp cutting blades with this high-performance layer system.

Nanocrystalline 3C—SiC layers or SiC layers consisting of nanocrystalline 3C—SiC and amorphous SiC or amorphous carbon, which have halogen content over an optimum concentration range, have not yet been described as wear protection layers. These layers can now be manufactured by our process, which advantageously makes it possible to set optimum halogen content by using halogen polysilanes or substituted halogen polysilanes over a broad temperature range.

As halogen polysilanes allow one to select the coating temperature at a significantly lower level compared to conventional precursors such as $SiCl_4$ or trichloromethylsilane, chemical reactions between the substrate material and the precursor can also be avoided. This makes it possible to directly coat metallic bodies.

Because of the favorable properties of our SiC layers and favorable manufacturing parameters, the layers can also be advantageously used in microelectronics.

Our coated bodies and methods will now be explained in greater detail with reference to examples.

Example 1

By a CVD process, a 1 µm thick TiN bonding layer was first deposited, followed by deposition of the layer on $Si_3N_4$ ceramic cutting inserts.

The coating process took place in a hot-wall CVD reactor with an internal diameter of 75 mm. Using a gas mixture of 0.3% vol. $Si_3Cl_8$, 97.7% vol. $H_2$, and 2.0% vol. $C_2H_4$ at a temperature of 900° C. and a pressure of 9 kPa, a 3.5 µm thick SiC layer was obtained after a coating time of 120 min.

This layer was investigated by x-ray thin-layer analysis carried out with sweeping incidence (see x-ray diffraction diagram FIG. 1). The diffractogram showed a <111> textured 3C—SiC layer. Using the Scherrer equation, average 3C—SiC grain size was determined to be 50 nm.

By WDX analysis, the chlorine content within the layers was determined to be 0.03 at. %.

Microhardness measurement using a Vickers indenter showed hardness of 3850 HV[0.01].

The layer was characterized by a smooth, homogeneous surface, a nanocrystalline structure, and a high degree of hardness.

Example 2

A layer was applied by a CVD process to WC/Co hard metal cutting inserts with a precoating consisting of 1 µm TiN and 2 µm TiCN.

Layer deposition also took place in a hot-wall CVD reactor with an internal diameter of 75 mm. A gas mixture of 0.3% vol. $Si_3Cl_8$, 93.7% vol. $H_2$, and 6.0% vol. $C_2H_4$ was used at a temperature of 800° C. and a pressure of 9 kPa. The layer was formed at a deposition rate of 0.5 µm/h.

Figure 2:
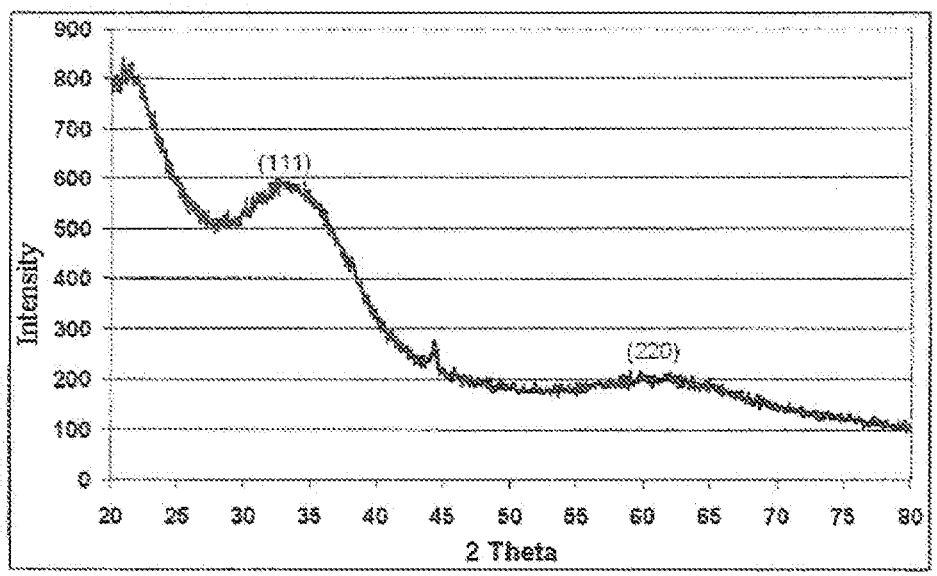
FIG. 2 is an XRD diffractogram of the mixed layer of nanocrystalline 3C—SiC and amorphous SiC according to Working Example 2.

The composition of the SiC layer was investigated by x-ray thin-layer analysis carried out with sweeping incidence (see x-ray diffraction diagram FIG. 2). The x-ray diffraction diagram showed broad reflexes of the 3C—SiC. Using the Scherrer equation, average grain size was determined to be 1 nm.

Figure 3:
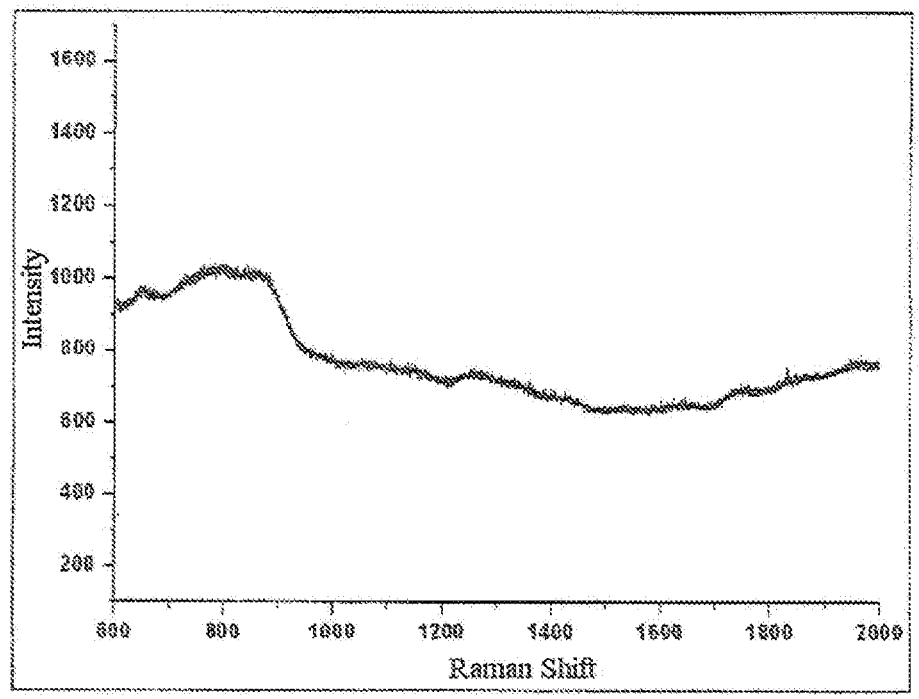
FIG. 3 is a Raman spectrum of the mixed layer of the nanocrystalline 3C—SiC layer and amorphous SiC according to Working Example 2.

Raman spectral analysis (see FIG. 3) showed that the peaks of 3C—SiC at 780 $cm^{-1}$ and 890 $cm^{-1}$ were not individually resolved; rather, a broad band could be seen at 800 $cm^{-1}$, which is typical for amorphous SiC. First partial separations indicated incipient crystallization. The layer did not contain any free carbon, as no peaks occurred in the region of 1300 $cm^{-1}$ to 1600 $cm^{-1}$. Based on the x-ray and Raman analyses, it could be assumed that the layer was composed of a mixture of nanocrystalline and amorphous SiC.

By WDX analysis, the chlorine content within the layers was determined to be 0.5 at. %.

Using a Vickers microhardness indenter, hardness was found to be 3600 HV[0.01].

The layer was characterized by a structure of nanocrystalline 3C—SiC and amorphous SiC, and showed a smooth surface and a high degree of hardness.

Example 3

A layer was directly deposited on $Si_3N_4$ ceramic indexable inserts by a CVD process.

Layer deposition took place in a hot-wall CVD reactor with an internal diameter of 75 mm. Using the gas mixture of 0.3% vol. $Si_3Cl_8$, 93.7% vol. $H_2$, and 6.0% vol. $C_2H_4$ at a temperature of 900° C. and a pressure of 9 kPa, a 3.6 µm thick SiC layer was obtained after a coating time of 120 min.

Figure 4:
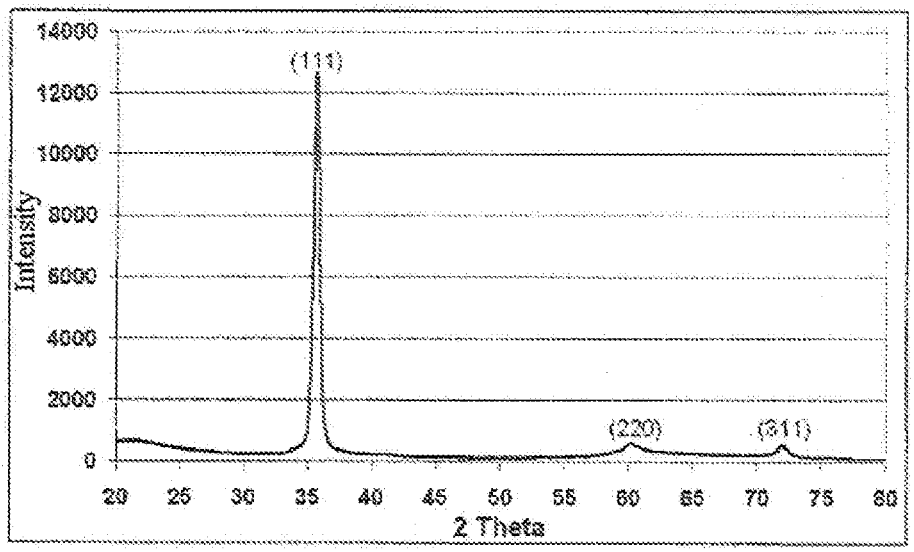
FIG. 4 is an XRD diffractogram of the mixed layer of the nanocrystalline 3C—SiC layer and amorphous carbon according to Working Example 3.

The layer was also characterized by x-ray thin-layer analysis carried out with sweeping incidence (see x-ray diffraction diagram FIG. 4). The 3C—SiC reflexes showed less breadth and were much more sharply distinct than in Working Example 2. Using the Scherrer equation, 3C—SiC grain size was determined to be 20 nm.

Figure 5:
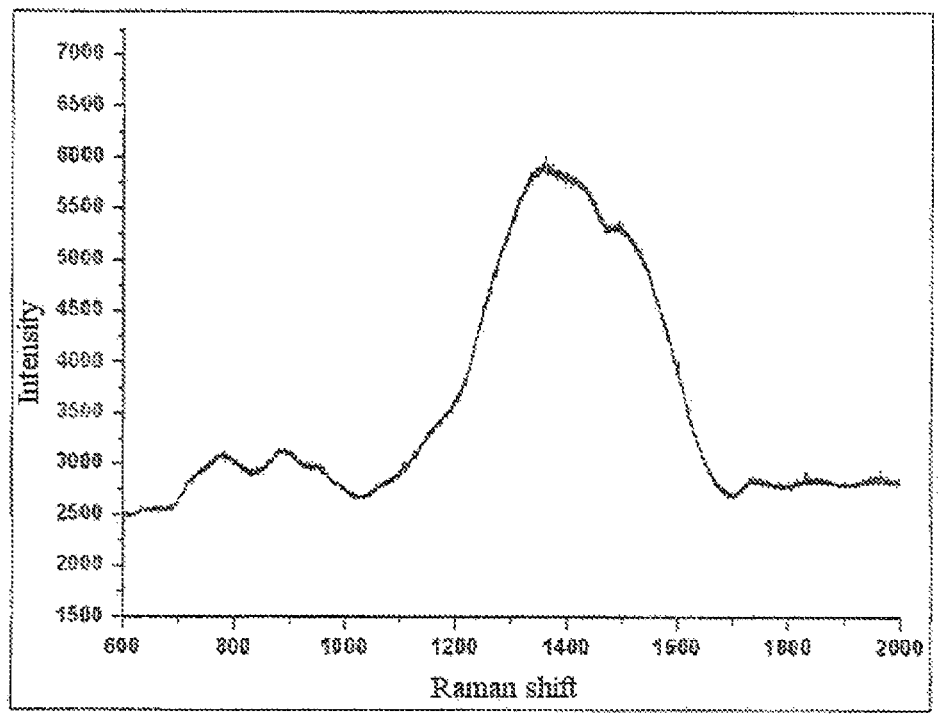
FIG. 5 is a Raman spectrum of the mixed layer of the nanocrystalline 3C—SiC layer and amorphous carbon according to Working Example 3.

Raman spectral analysis (see FIG. 5) showed the more sharply delineated peaks of 3C—SiC at 780 and 890 $cm^{-1}$ compared to Example 2. In addition, the spectrum showed a broad peak in the region of 1300 to 1550 $cm^{-1}$. This peak showed that this layer contained amorphous, graphite-like carbon in addition to nanocrystalline 3C—SiC.

By WDX analysis, the chlorine content within the layers was determined to be 0.16 at. %.

Microhardness measurement using a Vickers indenter showed hardness of 3650 HV[0.01].

The layer consisted of a mixture of nanocrystalline 3C—SiC and amorphous carbon, and was characterized by a smooth surface and a high degree of hardness.

The invention claimed is:

1. Bodies coated with a SiC layer or with a multilayer coating system that comprises at least a SiC layer, wherein the SiC layer consists of halogen-containing nanocrystalline 3C—SiC or a mixed layer consisting of halogen-containing nanocrystalline 3C—SiC and amorphous SiC or halogen-containing nanocrystalline 3C—SiC and amorphous carbon, the SiC layer having a cluster-free and non-porous dense, homogeneous structure, and has a halogen content of 0.0001 atm % to 2 atm %.

2. The bodies according to claim 1, wherein at least one selected from the group consisting of Cl, F, Br, and I are contained in the SiC layer as halogens.

3. The bodies according to claim 1, wherein the mixed layer contains amorphous SiC in an amount of 0.5 mass % to 99.5 mass %.

4. The bodies according to claim 1, wherein the amorphous SiC has a C:Si atomic ratio of 1 to 1.2.

5. The bodies according to claim 1, wherein the nanocrystalline 3C—SiC contains amorphous carbon in an amount of up to 10 mass %.

6. The bodies according to claim 1, wherein the nanocrystalline 3C—SiC has a crystallite size of <200 nm.

7. The bodies according to claim 1, wherein the SiC layer has a thickness of 0.1 µm to 100 µm.

8. The bodies according to claim 1, wherein the multilayer coating system consists of several SiC layers or at least one SiC layer and one or more layers selected from the group of the materials TiN, TiCN, TiC, $Al_2O_3$ and diamond.

9. The bodies according to claim 1, wherein the SiC layer is deposited directly on the body without an intermediate layer.

10. The bodies according to claim 1, wherein the SiC layer or the multilayer coating system is applied to bodies of metal, hard metal, cermet or ceramic as a wear protection or oxidation protection layer or for applications in microelectronics or photovoltaics.

11. Bodies coated with an SiC layer or with a multilayer coating system that contains at least an SiC layer, wherein the SiC layer consists of a mixed layer consisting of halogen-containing nanocrystalline 3C—SiC and amorphous SiC or halogen-containing nanocrystalline 3C—SiC and amorphous carbon, wherein the SiC layer shows a periodically or continuously varying ratio of halogen-containing nanocrystalline 3C—SiC to amorphous SiC or amorphous carbon.

\* \* \* \* \*